United States Patent [19]

Bastiaans

[11] Patent Number: 4,764,811

[45] Date of Patent: Aug. 16, 1988

[54] PICTURE SIGNAL PROCESSING CIRCUIT

[75] Inventor: Eduard A. Bastiaans, Eindhoven, Netherlands

[73] Assignee: U.S. Philips Corporation, New York, N.Y.

[21] Appl. No.: 907,708

[22] Filed: Sep. 15, 1986

[30] Foreign Application Priority Data

Sep. 19, 1985 [NL] Netherlands ............ 8502564

[51] Int. Cl.$^4$ ............................................. H04N 5/14
[52] U.S. Cl. ............................... 358/160; 358/169
[58] Field of Search ............ 358/169, 162, 96, 168, 358/160, 166, 110, 113, 170, 184, 111, 164, 174, 284, 181, 22

[56] References Cited

U.S. PATENT DOCUMENTS

| | | | |
|---|---|---|---|
| 3,205,446 | 9/1965 | Altemus | 358/166 |
| 3,597,617 | 8/1971 | Passaro | 250/83.3 |
| 3,704,342 | 11/1972 | Stoddard et al. | 358/113 |
| 4,187,519 | 2/1980 | Vitols et al. | 358/169 |
| 4,229,764 | 10/1980 | Danas | 358/160 |

FOREIGN PATENT DOCUMENTS 0091868 10/1983 European Pat. Off. ............ 358/169
1181758 2/1970 United Kingdom .

*Primary Examiner*—James J. Groody
*Assistant Examiner*—David E. Harvey
*Attorney, Agent, or Firm*—Thomas A. Briody

[57] ABSTRACT

A picture signal (PS1) occurring with picture information components at different signal levels in which the signal level differences are greater than the picture information differences at the signal levels is processed with the aid of an amplifier circuit (1-4) to produce a picture signal comprising picture information differences between a minimum and a maximum value. To this end the amplifier circuit comprises two parallel signal channels (1, 2) and (3, 4) and a change-over circuit (2, 4, 5-16) via which one channel for signal processing is operative dependent on the picture signal level, while per channel, for example, a different gain factor (A or B) and a different bias (OV or +Vb) is present for a signal level shift. Change-over is effected by a voltage comparison circuit (5-10, 12-15) which is connected to the output of an amplifier (1) of the amplifier circuit (1-4) and compares the output voltage with a subtantially constant direct voltage.

8 Claims, 2 Drawing Sheets

PICTURE SIGNAL PROCESSING CIRCUIT

BACKGROUND OF THE INVENTION

The invention relates to a picture signal processing circuit for processing a picture signal having picture information components at different signal levels. The majority of the signal level differences are greater than the picture information differences at the signal levels. The circuit is formed with an amplifier circuit having two parallel, first and second signal channels between an input and an output and a change-over circuit via which each time one of the two parallel signal channels of the amplifier circuit is operative for signal processing. The signal channels of the amplifier circuit are formed with amplifiers each having a different transmission characteristic.

A picture signal processing circuit of this type is known from British Pat. No. 1,181,758, more specifically for use in infrared picture signal processing. In thermal picture recording, scene components having relatively large temperature differences relative to the background may occur against a background of relatively small temperature differences. Consequently, the picture signal is obtained with the picture information components at different signal levels, the signal level differences being greater than the picture information differences at the signal levels. The generated picture signal has such a large signal range that the amplifier circuit and other circuits are overdriven without signal-limiting measures. To avoid overdrive the use is possible of the amplifier circuit with the two parallel signal channels and the amplifiers having the different transmission characteristics and the change-over circuit.

It has been described that it is possible to use a normal picture signal amplifier in combination with an amplifier which is only operative for a picture signal giving information around a given signal level which is located between two pre-determined values which correspond to the limit values of a given temperature range, that is to say, located in a given thermal band. The thermal band may be adjusted, as desired, within the total temperature range. The problem has been described that without further measures no distinction can be made between information from within and outside the thermal band when the obtained picture signal combination is displayed. To solve this problem, it is proposed to periodically switch the change-over circuit in such a way that the thermal band information is displayed with a periodical duration which is different from the information occurring outside the thermal band. The distinction in information thereby becomes manifest in a periodically longer or shorter display time. It has been described that such a display is advantageous in the case of a photographic recording of the displayed picture due to the longer or shorter exposure time.

In the case of display of a picture which can be observed directly, the solution described leads to an unacceptable picture in which a flickering phenomenon is involved in the distinction of information.

SUMMARY OF THE INVENTION

It is an object of the invention to provide a picture signal processing circuit in which starting from the described input picture signal an output picture signal is formed with a limited signal range in which picture information contrasts originating from different signal levels occur. To this end, a picture signal processing circuit according to the invention is characterized in that the change-over circuit is formed with a voltage comparison circuit for comparing by means of a substantially constant direct voltage the output voltage applied to an input thereof and originating from one of the signal channel amplifiers, while dependent on the comparison result the first or the second signal channel is operative for signal processing.

An embodiment of a picture signal processing circuit according to the invention in which a smooth change-over is effected between the signal channels is characterized in that in the case of unequal gain factors of the amplifiers, the signal channel amplifier having the largest gain factor is connected to the voltage comparison circuit.

A further embodiment in which an optimum composite output picture signal occurs is characterized in that in the case of unequal gain factors of the amplifiers in the signal channel amplifier having the smallest gain factor a bias for a signal level shift is located outside the output voltage range of the signal channel amplifier having the largest gain factor and operating for signal processing in the picture signal processing circuit.

BRIEF DESCRIPTION OF THE DRAWING

The invention will be further described by way of example with reference to the accompanying drawing in which.

DESCRIPTION OF THE PREFERRED EMBODIMENTS

Figure 1:
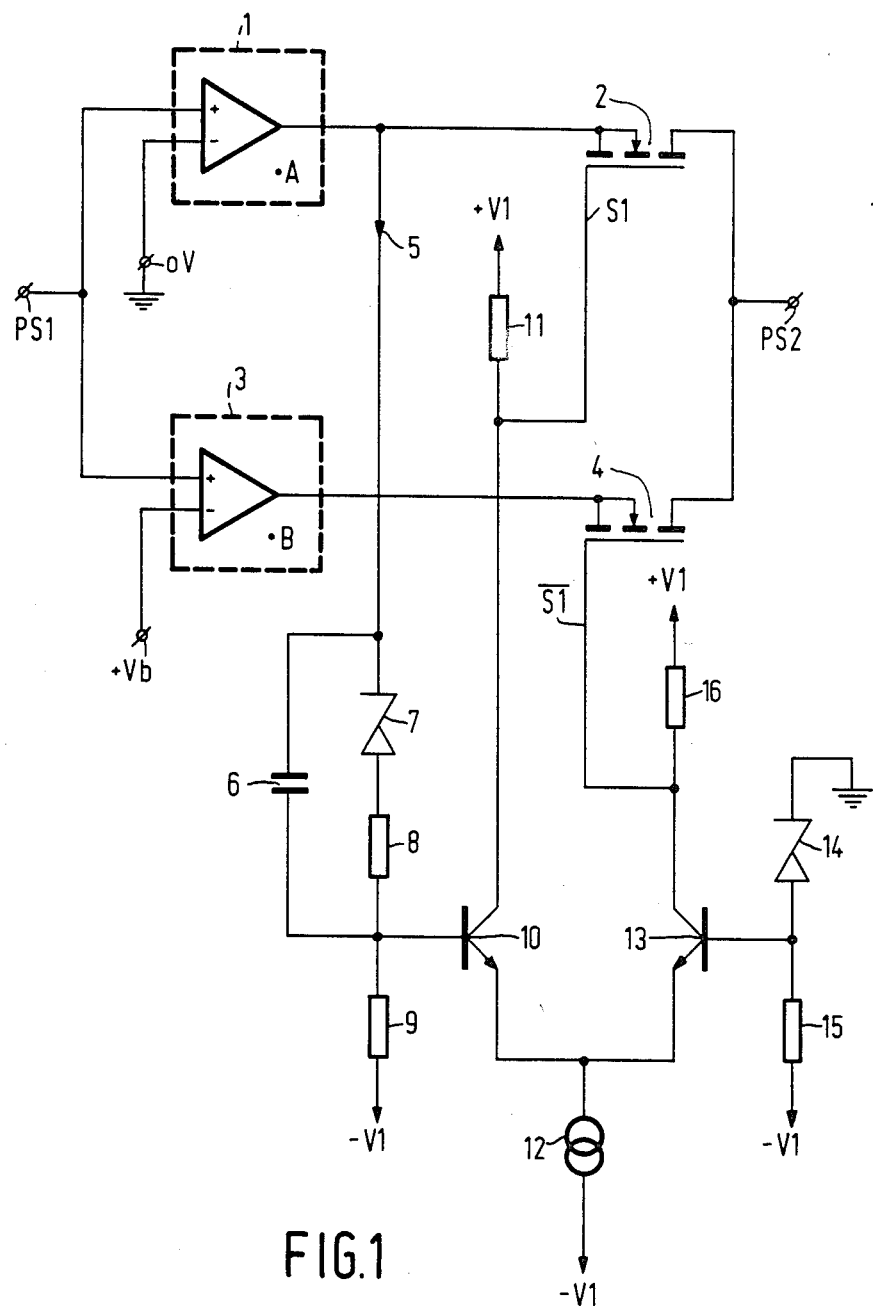
FIG. 1 shows a circuit diagram of a picture signal processing circuit according to the invention.
Figure 2:
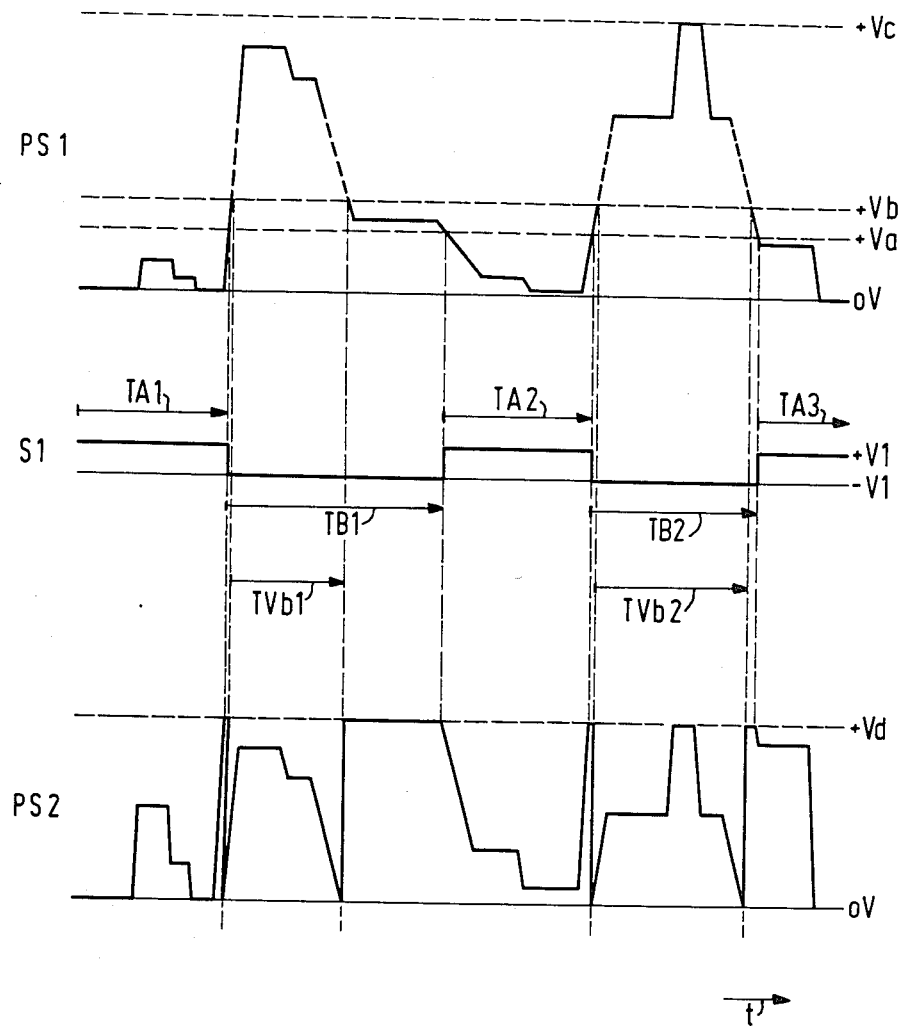
FIG. 2 shows some signal diagrams as a function of time to clarify the operation of the circuit of FIG. 1.

FIG. 1 shows an input terminal of a picture signal processing circuit according to the invention to which an input picture signal PS1 is applied. In FIG. 2 a diagrammatically shown signal diagram has been given by way of example as a function of time t for the input picture signal PS1. In the signal PS1 four voltage levels are indicated by the ground potential of 0V, a voltage +Va, a higher voltage +Vb and a still higher voltage +Vc. The signal PS1 is shown with picture information components at different signal levels, the majority of the signal level differences being greater than the picture information differences at the signal levels. Thus there is a relevant picture information between the ground potential of 0V and the voltage +Va and between the voltages +Vb and +Vc.

It is assumed that irrelevant information occurs between the voltages +Va and +Vb. Furthermore, it is assumed that the input signal range varies from the ground potential of 0V up to the largest shown peak value of +Vc volt and that this range is too large to be further processed without signal-limiting measures so as to achieve an ultimate display of the picture information.

The described input picture signal PS1 originates, for example, from an infrared or X-ray picture signal source. It is not important to the invention which specific source the picture signal PS1 originates from. Furthermore, the picture signal PS1 may be suitable for television display in colour or black and white, with the television system being standardized or not standardized.

FIG. 1 shows an output terminal of the picture signal processing circuit at which an output picture signal PS2 occurs. The output picture signal PS2 may be derived from the output terminal for further conventional signal processing operations. Starting from the signal diagram of the input picture signal PS1 shown in FIG. 2, a signal diagram for the output picture signal PS2 derived therefrom is shown in FIG. 2. The signal PS2 has a signal range between a minimum value equal to the ground potential of 0V and a maximum voltage value of +Vd. A comparison of the picture signals PS1 and PS2 shows that the picture information differences mentioned as being relevant occur within the limited signal range from 0V to +Vd. Upon display of the output picture signal PS2 a maximum contrast is obtained for the picture information components which originally occur at the two extreme values of the input signal range.

To obtain the output picture signal PS2 of FIG. 2, the circuit of FIG. 1 is formed with an amplifier 1, succeeded by a switching transistor 2, and parallel thereto an amplifier 3 succeeded by a switching transistor 4. The picture signal processing circuit is thus formed with an amplifier circuit (1–4) comprising two parallel signal channels (1, 2) and (3, 4) between the amplifier input for applying the picture signal PS1 and the amplifier output for supplying the picture signal PS2.

The amplifiers 1 and 3 are shown with a single differential amplifier for the sake of simplicity, but they may comprise several amplifier stages. Furthermore circuit elements which are normally required such as resistors for compensating signal current and voltage offsets in amplifiers are not shown.

In the amplifiers 1 and 3 the respective gain factors are denoted by A and B, assuming that the gain factor A is larger than the gain factor B. A further essential difference between the amplifiers 1 and 3 is the supply of a different bias. FIG. 1 shows that while the signal PS1 is applied to the (+) inputs of the differential amplifiers, the (−) input of the amplifier 1 is connected to a ground terminal with the ground potential of 0V, and the (−) input of the amplifier 3 is connected to a terminal carrying the voltage +Vb. With respect to the ground potential of 0V as a bias in the amplifier 1, the supply of the bias +Vb ensures that the amplifier 3 operates with a signal level shift.

The switching transistors 2 and 4 are shown by way of example as transistors formed with isolated gate electrodes, more specifically as n-channel MOSFET transistors. The source electrodes are coupled to the amplifier outputs and the drain electrodes are connected to the output terminal carrying the picture signal PS2. The gate electrode of the transistor 2 receives a switching signal whose signal S1 diagram is plotted in FIG. 2. The gate electrode of the transistor 4 receives an inverse switching signal $\overline{S1}$ which can be derived by means of polarity reversal from the signal S1 shown in FIG. 2.

FIG. 2 shows that the signal S1 has a square-wave variation between voltages +V1 and −V1. In the presence of the voltage +V1 or −V1 at a gate electrode the relevant switching transistor 2 or 4 is conducting or non-conducting, respectively. The switching signals S1 and $\overline{S1}$ are generated in a change-over circuit to be described hereinafter.

In FIG. 1 the head 5 of an arrow denotes an input of a change-over circuit which is furthermore an input of a voltage comparison circuit present therein. The input 5 is coupled to a parallel arrangement of a capacitor 6 and of a series arrangement of a zener diode 7 and a resistor 8. The capacitor 6 operates as a high-frequency shunt for the series arrangement of the zener diode 7 and the resistor 8. The junction of the capacitor 6 and the resistor 8 is connected via a resistor 9 to a supply terminal carrying the voltage −V1 and is furthermore connected to the base electrode of an npn transistor 10.

The collector electrode of the transistor 10 is connected via a resistor 11 to a supply terminal carrying the voltage +V1 and is furthermore connected to the gate electrode of the transistor 2. The supply voltages +V1 and −V1 and the bias +Vb originate from a voltage source (not shown) a terminal of which is assumed to be connected to ground.

The emitter electrode of the transistor 10 is connected to a connection terminal of a current source 12, another connection terminal of which is connected to a supply terminal carrying the voltage −V1. The first-mentioned connection terminal of the current source 12 is also connected to the emitter electrode of an npn transistor 13. The base electrode of the transistor 13 is connected to the junction of a zener diode 14 and a resistor 15 which are connected at the other end to ground and to a supply terminal, respectively, carrying the voltage −V1. The collector electrode of the transistor 13 is connected via a resistor 16 to a supply terminal carrying the voltage +V1 and is connected directly to the gate electrode of the transistor 4.

Thus FIG. 1 shows a change-over circuit (2, 4, 5–16) comprising a voltage comparison circuit (5–10, 12–15). This voltage comparison circuit operates for the purpose of comparing the voltage applied to the input 5 with the substantially constant direct voltage at the junction of the zener diode 14 and the resistor 15. Dependent on the comparison result the signal channel (1, 2) or (3,4) is operative for signal processing in which, as desired, a smooth change-over is effected.

To explain the operation of the picture signal processing circuit according to FIG. 1, the following applies, while reference is made to FIG. 2 for clarification. It is assumed that there is initially a signal variation in the input picture signal PS1 between the ground potential of 0V and substantially the voltage +Va. The output signal from the amplifier 1 then has a signal variation between 0V and substantially the voltage +Vd, for which it holds that Vd=A.Va. The voltage at the input 5 of the voltage comparison circuit (5–10, 12–15), which is lower than the voltage +Vd, produces a voltage at the base electrode of the transistor 10 which is more negative than the voltage at the base electrode of the transistor 13. The current source 12 and the transistor 13 are then conducting and the transistor 10 is non-conducting. The result is that the gate electrode of the transistor 2 receives the voltage +V1, while the gate electrode of the transistor 4 simultaneously receives substantially the voltage −V1. The voltage drop across the conducting transistor 13 is substantially disregarded and the same applies to the other transistors if they are conducting. The result is that the signal channel (1, 2) operates for signal processing and their associated durations are denoted by TA1, TA2 and TA3 at the switching signal S1.

Secondly, it is assumed that the input picture signal PS1 reaches the voltage +Va and slightly exceeds it, as is shown in FIG. 2 at the end of the durations TA1 and TA2. The voltage +Vd then occurs in the output signal of the amplifier 1, the voltages at the base electrodes of the transistors 10 and 13 being equal to each other If the zener diodes 7 and 14 have the same voltage drop, the resistor 8 has a voltage drop which is equal to Vd. The slight extent to which the voltage +Vd is exceeded by the amplifier output voltage at the input 5 leads to the transistor 10 becoming conducting and transistor 13 becoming non-conducting. Due to the supply of the voltage −V1 to the transistor 2, this transistor becomes non-conducting and due to the supply of the voltage +V1 to the transistor 4, this transistor becomes conducting. The amplifier 3 is then not operative (yet) for signal processing, because the input picture signal PS1 has a lower voltage than the bias +Vb. It is assumed that the amplifier 3 has an amplifier output voltage which is equal to +Vd for the voltage values at the (+) input which are smaller than the bias +Vb at the (−) input. When the voltage Vb is reached at the (+) input of the amplifier 3, it becomes operative for signal processing, while the amplifier output signal decreases from the value +Vd to the ground potential of 0V and subsequently amplifies the input picture signal PS1 from the value +Vb by the factor of B. FIG. 2 shows durations TB1 and TB2 during which the transistor 4 is conducting and in durations TVb1 and TVb2 occurring therein the amplifier 3 is directly operative for picture signal processing.

It is found that for voltage values between +Va and +Vb there is no direct signal processing in the input picture signal PS1, but the amplifier 3 supplies the voltage Vd. Instead an amplifier may be used which supplies the ground potential of 0V or a voltage of less than +Vd under these circumstances. In the variation of the input picture signal PS1 shown in FIG. 2 the peak value +Vd occurs for a short time in the output picture signal PS2 before the commencement of the duration TVb1 and before the commencement and after the end of the duration TVb2. Upon display of the picture signal PS2 these short durations with the peak value +Vd produce bright contours in the picture. These contours in the displayed picture may be favourable to emphasize which original signal level the local picture information originates from. After the end of the duration TVb1 in the remaining part of the duration TB1, a bright part occurs in the displayed picture. If this bright part is experienced as being disturbing in the display of the picture signal PS2, it is possible to reduce the bias +Vb down to near the value +Va. The duration TVb1 is then increased to substantially the duration TB1 so that also in this case a bright contour occurs. To obtain an optimum composite output picture signal PS2 it is generally required that in the signal channel amplifier 3 with the smallest gain factor equal to B the bias +Vb for a signal level shift is located outside the output voltage range from 0V to +Va of the signal channel amplifier 1 having the largest gain factor equal to A and operating for signal processing in the picture signal processing circuit. In FIG. 2 the picture signals PS1 and PS2 have been given by way of example with positive voltage values, but a combination of positive and negative voltage values or the use of negative values is also possible.

The change-over circuit (2, 4, 5–16) of FIG. 1 realizes a change-over between the outputs of the amplifiers 1 and 3. In this case there is a simple change-over by having the switching transistors 2 and 4 succeed the amplifiers 1 and 3, respectively, in the signal cannnels (1, 2) and (3, 4), respectively. Another possibility would be a change-over between the inputs of the amplifiers 1 and 3. The embodiment shown in FIG. 1 in which the input 5 of the change-over circuit (2, 4, 5–16) is connected to the output of the amplifier 1 having the largest gain factor A is found to lead to a smooth change-over in practice.

For a survey of voltage values and gain factors in a practical embodiment of the picture signal processing circuit we mention:
gain factor A=5 and B=1
voltage value Va=1V, Vb=1.5V, Vc=6.5V Vd=5V and V1=12V.

In the given embodiment the picture signal processing circuit is suitable for processing an input picture signal PS1 having a signal range of between 0V and +6.5V, in which picture signal contrasts to be considered as relevant occur between 0V and +1V, and 1.5V and 6.5V. With respect to the voltage level +½V there are contrasts up to + and −½V and with respect to the voltage level +4V there are contrasts up to + and −2.5V, while there is a difference of 3.5V between the levels. The circuit supplies the output picture signal PS2 with a desired signal range limited from 0V to +5V in which the original contrasts from 0V to 1V occur five times amplified and the original contrasts from +1.5V to +6.5V occur unchanged in magnitude but with the voltage shift. It is evident that, if desired, different signal ranges and levels can be chosen for picture signal processing.

What is claimed is:

1. A picture signal processing circuit for processing a picture signal occuring with picture information components at different signal levels, said circuit being formed with an amplifier circuit having two parallel, first and second signal channels connected between an input and an output and a change-over circuit via which only one at a time of the two parallel signal channels of the amplifier circuit processes the picture signal, the signal channels of the amplifier circuit being formed with respective amplifiers each having a different transmission characteristic, characterized in that the change-over circuit is formed with a single voltage comparison circuit for comparing a constant direct voltage to a voltage applied to an input thereof and originating from the output of only one of the amplifiers, while dependent on the comparison result the first or the second signal channel processes the picture signal.

2. A picture signal processing circuit as claimed in claim 1, characterized in that the amplifiers have unequal gain, and the amplifier having the largest gain is connected to the voltage comparison circuit.

3. A picture signal processing circuit as claimed in claim 1 or 2, characterized in that the amplifiers have unequal gains and have output voltage ranges, the amplifier having the smallest gain has a bias for shifting a signal level by an amount greater than the output voltage range of the amplifier having the largest gain.

4. A picture signal processing circuit for processing a picture signal having first and second signal levels, said circuit comprising:
 a picture signal input for receiving the picture signal;
 a display signal output for providing a display signal;
 a first signal channel connected between the picture signal input and the display signal output, said first signal channel comprising a first amplifier with first transmission characteristics, said first signal channel receiving the picture signal and producing a first signal channel output signal;
 a second signal channel connected between the picture signal input and the display signal output, said second signal channel comprising a second amplifier with second transmission characteristics different from the first transmission characteristics, said second signal channel receiving the picture signal and producing a second signal channel output signal;

a switching circuit having a first state for connecting the picture signal input to the display signal output via only the first signal channel, and having a second state for connecting the picture signal input to the display signal output via only the second signal channel; and a single voltage comparison circuit for comparing the first signal channel output signal to a preselected DC switching voltage, said voltage comparison circuit causing the switching circuit to be in the first state when the first signal channel output signal is on one side of the preselected switching voltage, said voltage comparison circuit causing the switching circuit to be in the second state when the first signal channel output signal is one the other side of the preselected switching voltage.

5. A picture signal processing circuit as claimed in claim 4, characterized in that said voltage comparison circuit causes the switching circuit to be in the first state when the first signal channel output signal is less than the preselected switching voltage, and said voltage comparison circuit causes the switching circuit to be in the second state when the first signal channel output signal is greater than the preselected switching voltage.

6. A picture signal processing circuit as claimed in claim 5, characterized in that:

when the picture signal has a value in an intermediate range between the first and second signal levels, the display signal has a contour value; and the contour value is a fixed, preselected value.

7. A picture signal processing circuit as claimed in claim 6, characterized in that the contour value corresponds to a bright image on a display.

8. A picture signal processing circuit as claimed in claim 6, characterized in that the contour value correspond to a dark image on a display.

* * * * *